United States Patent
Yenrudee et al.

(10) Patent No.: US 10,242,953 B1
(45) Date of Patent: Mar. 26, 2019

(54) SEMICONDUCTOR PACKAGE WITH PLATED METAL SHIELDING AND A METHOD THEREOF

(71) Applicant: UTAC Headquarters PTE. LTD., Singapore (SG)

(72) Inventors: Suebphong Yenrudee, Bangkok (TH); Chanapat Kongpoung, Nonthaburi (TH); Sant Hongsongkiat, Bangkok (TH); Siriwanna Ounkaew, Lop-Buri (TH); Chatchawan Injan, Nakhonnayok (TH); Saravuth Sirinorakul, Bangkok (TH)

(73) Assignee: Utac Headquarters PTE. Ltd, Singapore (SG)

( * ) Notice: Subject to any disclaimer, the term of this patent is extended or adjusted under 35 U.S.C. 154(b) by 12 days.

(21) Appl. No.: 15/167,757

(22) Filed: May 27, 2016

Related U.S. Application Data

(60) Provisional application No. 62/167,157, filed on May 27, 2015.

(51) Int. Cl.
*H01L 23/552* (2006.01)
*H01L 23/495* (2006.01)
(Continued)

(52) U.S. Cl.
CPC ...... *H01L 23/552* (2013.01); *H01L 21/31058* (2013.01); *H01L 21/32051* (2013.01); *H01L 21/565* (2013.01); *H01L 21/6836* (2013.01); *H01L 21/78* (2013.01); *H01L 23/3114* (2013.01); *H01L 23/49541* (2013.01); *H01L 23/49575* (2013.01); *H01L 24/32* (2013.01);
(Continued)

(58) Field of Classification Search
None
See application file for complete search history.

(56) References Cited

U.S. PATENT DOCUMENTS

| 3,611,061 A | 10/1971 | Segerson |
| 4,411,719 A | 10/1983 | Lindberg |

(Continued)

OTHER PUBLICATIONS

Non-Final Office Action dated May 26, 2011, U.S. Appl. No. 12/579,600, filed Oct. 15, 2009, Woraya Benjavasukul et al.

(Continued)

*Primary Examiner* — Tom Thomas
*Assistant Examiner* — Steven B Gauthier
(74) *Attorney, Agent, or Firm* — Haverstock & Owens LLP

(57) ABSTRACT

Embodiments of the present invention relate to a semiconductor package with a metal-plated shield. Surfaces of molding compound are roughened by an abrasion process such that the surfaces have an unnatural surface roughness that is rougher than a natural surface roughness. The roughened surfaces provide better adhesion of the metal-plated shield to the roughened surfaces than to untreated surfaces (e.g., surfaces with the natural surface roughness). A catalyst material can be deposited on the roughened surfaces of the molding compound before a metal layer is coated on the roughened surfaces of the molding compound to speed up the time for the metal layer to adhere to the roughened surfaces of the molding compound. The metal-plated shield can include plurality of metal layers plated on top of each other.

20 Claims, 15 Drawing Sheets

(51) Int. Cl.
 *H01L 23/31* (2006.01)
 *H01L 21/78* (2006.01)
 *H01L 21/3105* (2006.01)
 *H01L 21/3205* (2006.01)
 *H01L 21/683* (2006.01)
 *H01L 21/56* (2006.01)
 *H01L 23/00* (2006.01)
 *H01L 25/065* (2006.01)

(52) U.S. Cl.
 CPC .............. *H01L 24/49* (2013.01); *H01L 24/73* (2013.01); *H01L 25/0655* (2013.01); *H01L 2221/68327* (2013.01); *H01L 2224/32245* (2013.01); *H01L 2224/48091* (2013.01); *H01L 2224/48106* (2013.01); *H01L 2224/48245* (2013.01); *H01L 2924/01028* (2013.01); *H01L 2924/01029* (2013.01); *H01L 2924/3025* (2013.01)

(56) References Cited

U.S. PATENT DOCUMENTS

| | | |
|---|---|---|
| 4,501,960 A | 2/1985 | Jouvet et al. |
| 4,801,561 A | 1/1989 | Sankhagowit |
| 4,827,376 A | 5/1989 | Voss |
| 4,855,672 A | 8/1989 | Shreeve |
| 5,247,248 A | 9/1993 | Fukunaga |
| 5,248,075 A | 9/1993 | Young et al. |
| 5,396,185 A | 3/1995 | Honma et al. |
| 5,397,921 A | 3/1995 | Karnezos |
| 5,455,455 A | 10/1995 | Badehi |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,866,949 A | 2/1999 | Schueller |
| 5,990,692 A | 11/1999 | Jeong et al. |
| 6,072,239 A | 6/2000 | Yoneda et al. |
| 6,111,324 A | 8/2000 | Sheppard et al. |
| 6,136,460 A | 10/2000 | Chen et al. |
| 6,159,770 A | 12/2000 | Tetaka et al. |
| 6,229,200 B1 | 5/2001 | Mclellan et al. |
| 6,242,281 B1 | 6/2001 | Mclellan et al. |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,376,921 B1 | 4/2002 | Yoneda et al. |
| 6,392,427 B1 | 5/2002 | Yang |
| 6,400,004 B1 | 6/2002 | Fan et al. |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,489,218 B1 | 12/2002 | Kim et al. |
| 6,498,099 B1 | 12/2002 | McLellan et al. |
| 6,506,314 B1 | 1/2003 | Whitney, Jr. et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,639,308 B1 | 10/2003 | Crowley et al. |
| 6,660,626 B1 | 12/2003 | Lin |
| 6,667,191 B1 | 12/2003 | McLellan et al. |
| 6,686,667 B2 | 2/2004 | Chen et al. |
| 6,703,696 B2 | 3/2004 | Ikenaga et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,897,428 B2 | 5/2005 | Minamio et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,969,638 B2 | 11/2005 | Estepa et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 2/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,224,048 B1 | 5/2007 | McLellan et al. |
| 7,205,178 B2 | 7/2007 | Shiu et al. |
| 7,247,526 B1 | 7/2007 | Fan et al. |
| 7,274,088 B2 | 9/2007 | Wu et al. |
| 7,314,820 B2 | 1/2008 | Lin et al. |
| 7,315,080 B1 | 1/2008 | Fan et al. |
| 7,320,937 B1 | 1/2008 | Pal et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,451,539 B2 | 11/2008 | Morris et al. |
| 7,482,690 B1 | 1/2009 | Fan et al. |
| 7,595,225 B1 | 9/2009 | Fan et al. |
| 7,714,418 B2 | 5/2010 | Lim et al. |
| 8,053,872 B1 * | 11/2011 | Swan ....................... C25D 5/12 257/659 |
| 8,084,299 B2 | 12/2011 | Tan |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2004/0014257 A1 | 1/2004 | Kim et al. |
| 2004/0046237 A1 | 3/2004 | Abe et al. |
| 2004/0046241 A1 | 3/2004 | Combs et al. |
| 2004/0080025 A1 | 4/2004 | Kasahara et al. |
| 2004/0110319 A1 | 6/2004 | Fukutomi et al. |
| 2004/0209443 A1 | 10/2004 | Cadieux et al. |
| 2005/0003586 A1 | 1/2005 | Shimanuki et al. |
| 2005/0037618 A1 | 2/2005 | Lee et al. |
| 2005/0077613 A1 | 4/2005 | McLellan et al. |
| 2006/0192295 A1 | 8/2006 | Lee et al. |
| 2006/0223229 A1 | 10/2006 | Kirloskar et al. |
| 2006/0223237 A1 | 10/2006 | Combs et al. |

(56) References Cited

U.S. PATENT DOCUMENTS

| | | |
|---|---|---|
| 2006/0273433 A1 | 12/2006 | Itou et al. |
| 2007/0001278 A1 | 1/2007 | Jeon et al. |
| 2007/0090497 A1 | 4/2007 | Abbott |
| 2007/0090529 A1 | 4/2007 | McCarthy et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2008/0246132 A1 | 10/2008 | Kasuya et al. |
| 2009/0002972 A1* | 1/2009 | Carey ............... H01L 23/552 361/818 |
| 2009/0039530 A1 | 2/2009 | Fryklund |
| 2009/0294928 A1 | 12/2009 | Kim et al. |
| 2009/0302435 A1 | 12/2009 | Pagaila et al. |
| 2010/0184256 A1* | 7/2010 | Chino ............... H01L 21/561 438/118 |
| 2010/0207258 A1 | 8/2010 | Eun et al. |
| 2011/0115066 A1 | 5/2011 | Kim |
| 2012/0119373 A1* | 5/2012 | Hunt ............... H01L 21/565 257/774 |
| 2012/0146163 A1 | 6/2012 | Ho et al. |
| 2012/0241922 A1 | 9/2012 | Pagaila |
| 2012/0295085 A1 | 11/2012 | Iida et al. |
| 2014/0167232 A1 | 6/2014 | LoBianco et al. |
| 2014/0264839 A1* | 9/2014 | Tsai ............... H01L 23/49816 257/737 |
| 2015/0235873 A1* | 8/2015 | Wu ............... H01L 21/565 438/107 |
| 2015/0344730 A1* | 12/2015 | Lee ............... C08G 14/06 438/127 |
| 2016/0163566 A1* | 6/2016 | Chen ............... H01L 25/105 257/774 |

OTHER PUBLICATIONS

Notice of Publication dated Sep. 29, 2011, U.S. Appl. No. 13/156,257, filed Jun. 8, 2011, Woraya Benjavasukul et al.

Final Office Action dated Nov. 8, 2011, U.S. Appl. No. 12/579,600, filed Oct. 15, 2009, Woraya Benjavasukul et al.

Final Office Action dated Jul. 24, 2012, U.S. Appl. No. 13/156,257, filed Jun. 8, 2011, Woraya Benjavasukul et al.

* cited by examiner

SEMICONDUCTOR PACKAGE WITH PLATED METAL SHIELDING AND A METHOD THEREOF

CROSS-REFERENCE TO RELATED APPLICATION(S)

This patent application claims priority under 35 U.S.C. § 119(e) of the U.S. Provisional Patent Application Ser. No. 62/167,157, filed May 27, 2015, entitled "SEMICONDUCTOR PACKAGE WITH PLATING METAL SHIELD," which is hereby incorporated by reference in its entirety.

This patent application is a continuation in part of co-pending U.S. patent application Ser. No. 14/571,036, filed Dec. 15, 2014, entitled "CONDUCTIVE SHIELD FOR SEMICONDUCTOR PACKAGE," which claims priority under 35 U.S.C. § 119(e) of U.S. Provisional Patent Application Ser. No. 61/916,712, filed Dec. 16, 2013, entitled "CONDUCTIVE SHIELD FOR SEMICONDUCTOR PACKAGE," which are all hereby incorporated by reference in their entirety.

FIELD OF THE INVENTION

The present invention relates to semiconductor packaging. More specifically, the present invention relates to protective elements for the semiconductor packaging.

BACKGROUND OF THE INVENTION

Most radio frequency (RF) electronic components require electromagnetic interference (EMI) shielding. Conventional packages use metal lids or cans for the shielding. However, the metal lid has disadvantages in terms of the size density and costs. FIG. 1 illustrates a cross-sectional view of a conventional package with a metal lid 102 coupling with an electronic component 104.

SUMMARY OF THE INVENTION

Embodiments of the present invention relate to a semiconductor package with a metal-plated shield. Surfaces of molding compound are roughened by an abrasion process such that the surfaces have an unnatural surface roughness that is rougher than a natural surface roughness. The roughened surfaces provide better adhesion of the metal-plated shield to the roughened surfaces than to untreated surfaces (e.g., surfaces with the natural surface roughness). A catalyst material can be deposited on the roughened surfaces of the molding compound before a metal layer is coated on the roughened surfaces of the molding compound to speed up the time for the metal layer to adhere to the roughened surfaces of the molding compound. The metal-plated shield can include plurality of metal layers plated on top of each other.

In one aspect, a semiconductor package is provided. The semiconductor package includes a leadframe including a plurality of terminals. The plurality of terminals includes exterior terminals. Each of the exterior terminals is exposed at a bottom of the semiconductor package and a side of the semiconductor package. The semiconductor package also includes a die and a molding compound partially encapsulating the die and the exterior terminals. The molding compound includes surfaces that have an unnatural surface roughness that is rougher than the natural surface roughness of the molding compound. The semiconductor package also includes a metal-plated shield adhered to the roughened surfaces of the molding compound and to side surfaces of the exterior terminals.

In some embodiments, the metal-plated shield includes a plurality of metal layers plated on top of each other.

In some embodiments, the metal-plated shield is not adhered to a bottom surface of the semiconductor package.

In some embodiments, the side surfaces of the exterior terminals are substantially aligned with side surfaces of the molding compound.

In some embodiments, the roughness of a portion of the metal-plated shield that is adhered to the surfaces of the molding compound conforms to the unnatural surface roughness of the molding compound.

In some embodiments, the semiconductor package also includes a catalyst material anchored to the surfaces of the molding compound and configured to react with a metal on the surfaces of the molding compound to form the metal-plated shield.

In some embodiments, the semiconductor package also includes a protected area that is coupled with a tape that covers the entirety of the protected area of the semiconductor package such that the protected area does not have the metal-plated shield adhered to the protected area.

In some embodiments, the semiconductor package is positioned adjacent to at least one other semiconductor package on the tape. In some embodiments, the at least one other semiconductor package on the tape is similarly configured as the semiconductor package.

In another aspect, a method of manufacturing semiconductor devices is provided. The method includes obtaining a molded array that includes a package side and an interfacing side. The molded array includes a plurality of dies coupled to a substrate and molding compound encapsulating the plurality of dies, and surfaces of the molding compound has a natural surface roughness. The method also includes coupling an interfacing side of the molded array with a tape, performing a cut through procedure from the package side to the interfacing side, thereby forming a plurality of singulated semiconductor devices on the tape, and performing an abrasion procedure to roughen all surfaces of the molding compound such that, after the abrasion procedure, all surfaces of the molding compound have an unnatural surface roughness that is rougher than the natural surface roughness. The method also includes adhering a metal layer on the roughened surfaces and removing the plurality of singulated semiconductor devices from the tape.

In some embodiments, each of the plurality of singulated semiconductors on the tape includes side surfaces of exterior terminals that are substantially aligned with side surfaces of the molding compound.

In some embodiments, the adhesion of the metal layer on the roughened surfaces is better than adhesion of the metal layer on the surfaces of the molding compound having the natural surface roughness.

In some embodiments, obtaining a molded array includes obtaining the substrate, coupling the plurality of dies to a top surface of the substrate, encapsulating the plurality of dies with the molding compound, etching a portion of a bottom surface of the substrate, and insulation molding etched portions of the substrate.

In some embodiments, the abrasion procedure includes coating all exposed surfaces of the molding compound with an adhesion promoter material, heating the molded array with the adhesion promoter material such that the adhesion promoter material reacts with a portion of the molding compound, and etching away a baked film, which results in the molding compound having the roughened surfaces.

In some embodiments, the method further includes, after performing an abrasion procedure and before adhering a metal layer, depositing a catalyst material on all surfaces of the molding compound of each of the singulated semiconductor devices on the tape.

In some embodiments, the method further includes repeating depositing a catalyst material and adhering a metal layer until a desired metal-plated shield is obtained.

In yet another aspect, a method of manufacturing semiconductor devices is provided. The method includes obtaining a substrate, coupling a plurality of dies to a top surface of the substrate, and encapsulating the plurality of dies with a molding compound. The molding compound has a natural surface roughness. The method further includes etching a portion of a bottom surface of the substrate, insulation molding etched portions of the substrate, coupling the bottom surface of the substrate to a tape, performing full singulation cuts, thereby obtaining a plurality of singulated semiconductor devices that is coupled to the tape, roughening surfaces of the molding compound of each of the semiconductor devices on the tape such that the surfaces have an unnatural surface roughness that is rougher than the natural surface roughness of the molding compound, depositing a catalyst material on all surfaces of the molding compound of each of the semiconductor devices on the tape, coating a conductive metal on all surfaces of the molding compound of each of the semiconductor devices on the tape, and removing the tape from the plurality singulated semiconductor devices.

In some embodiments, the method includes repeating depositing a catalyst material and coating a conductive metal until a desired metal-plated shield is obtained.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE INVENTION

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
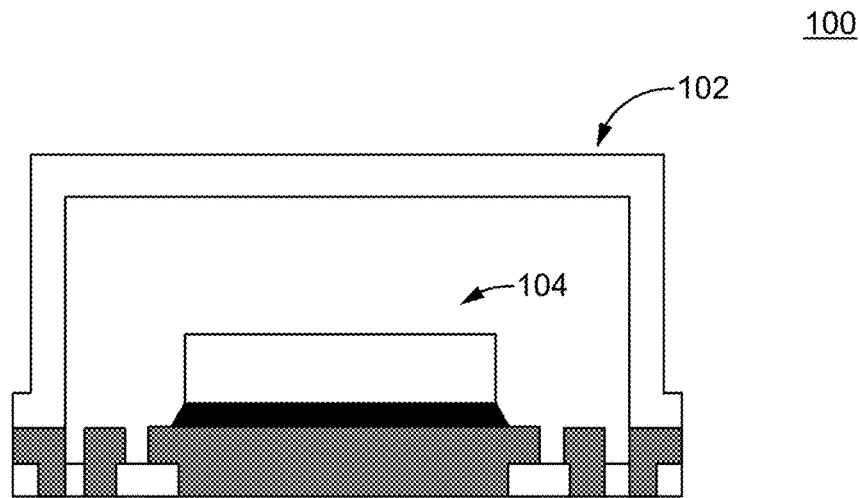
FIG. 1 illustrates a cross-sectional view of a conventional package with a metal lid coupling with an electronic component.
Figure 2:
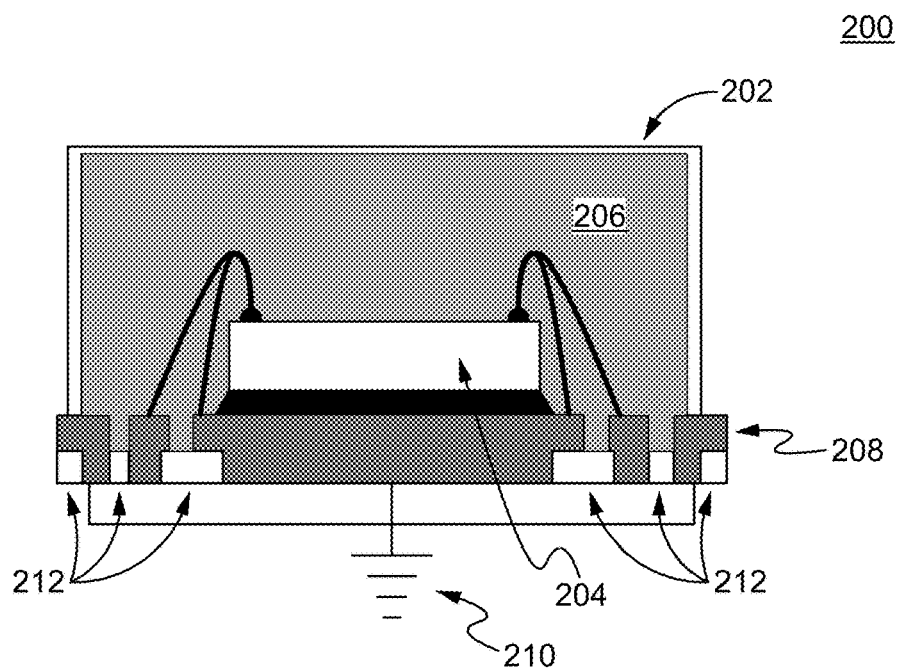
FIG. 2 illustrates a cross-sectional view of an exemplary semiconductor package in accordance with some embodiments of the present invention.

FIG. 2 illustrates a cross-sectional view of an exemplary semiconductor package 200 in accordance with some embodiments of the present invention. In some embodiments, the package 200 has electronic component(s) 204 coupled with a molding material 206 and a ground ring 208 coupled with a PCB ground 210. A protective layer 202 can be formed over the molding material 206. The electronic component 204 can be coupled with the ground ring 208. In some embodiments, insulating materials 212 enclose the package 200. In some embodiments, the insulating materials 212 are located at a bottom of the package 200.

In some embodiments, the protective layer 202 comprises a conductive polymer. A person of ordinary skill in the art appreciates that any other conductive materials are able to be used to form the protective layer 202. In some embodiments, the protective layer 202 provides a Faraday cage effect, which forms an enclosure blocking a transmission or reception of radio frequency waves and any other types of electromagnetic radiation, such as a radio frequency interference (RFI).

Figure 3A:
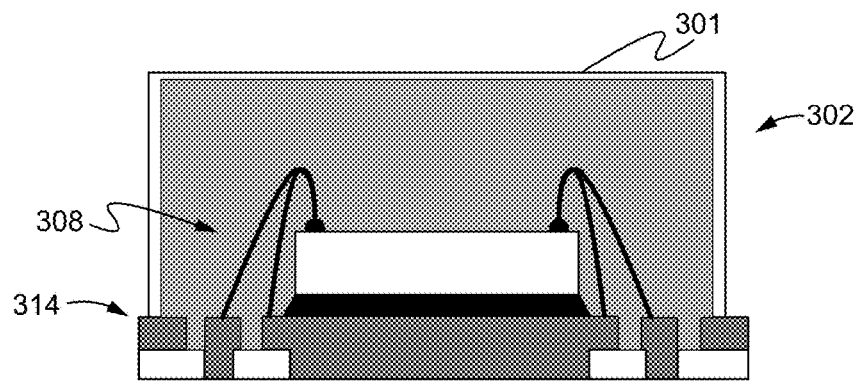
FIG. 3A illustrates cross-sectional views of additional exemplary semiconductor packages in accordance with some embodiments of the present invention.
Figure 3A:
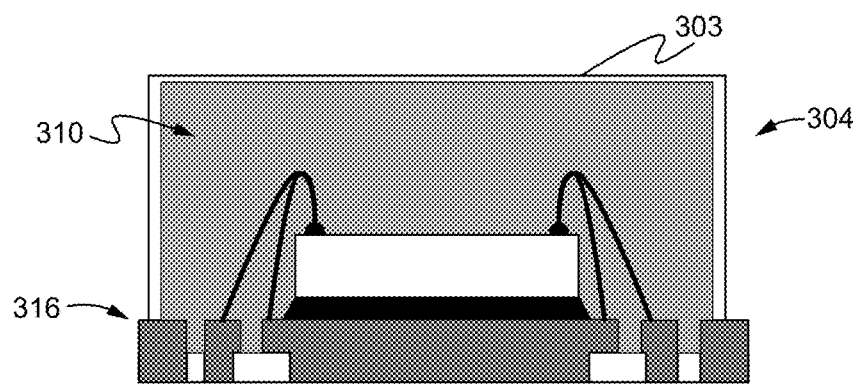
Figure 3A:
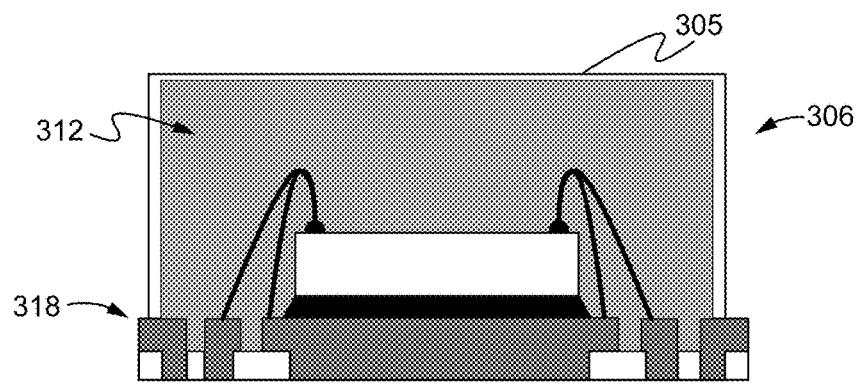

FIG. 3A illustrates cross-sectional views of additional exemplary semiconductor packages 300 in accordance with some embodiments of the present invention. In some embodiments, the semiconductor packages 300 comprises package 302, 304, and 306, which have conductive shields 301, 303, and 305, respectively. The conductive shields 301, 303, and 305 can be coated on the packages 302, 304, and 306, respectively. The conductive shields 301, 303, and 305 can encapsulate the molding compounds 308, 310, and 312 formed on, such as, a Land Grid Array (LGA) package. In some embodiments, the semiconductor packages 302, 304, and 306 comprises series feature ground ring structures 314, 316, and 318, respectively.

Figure 3B:
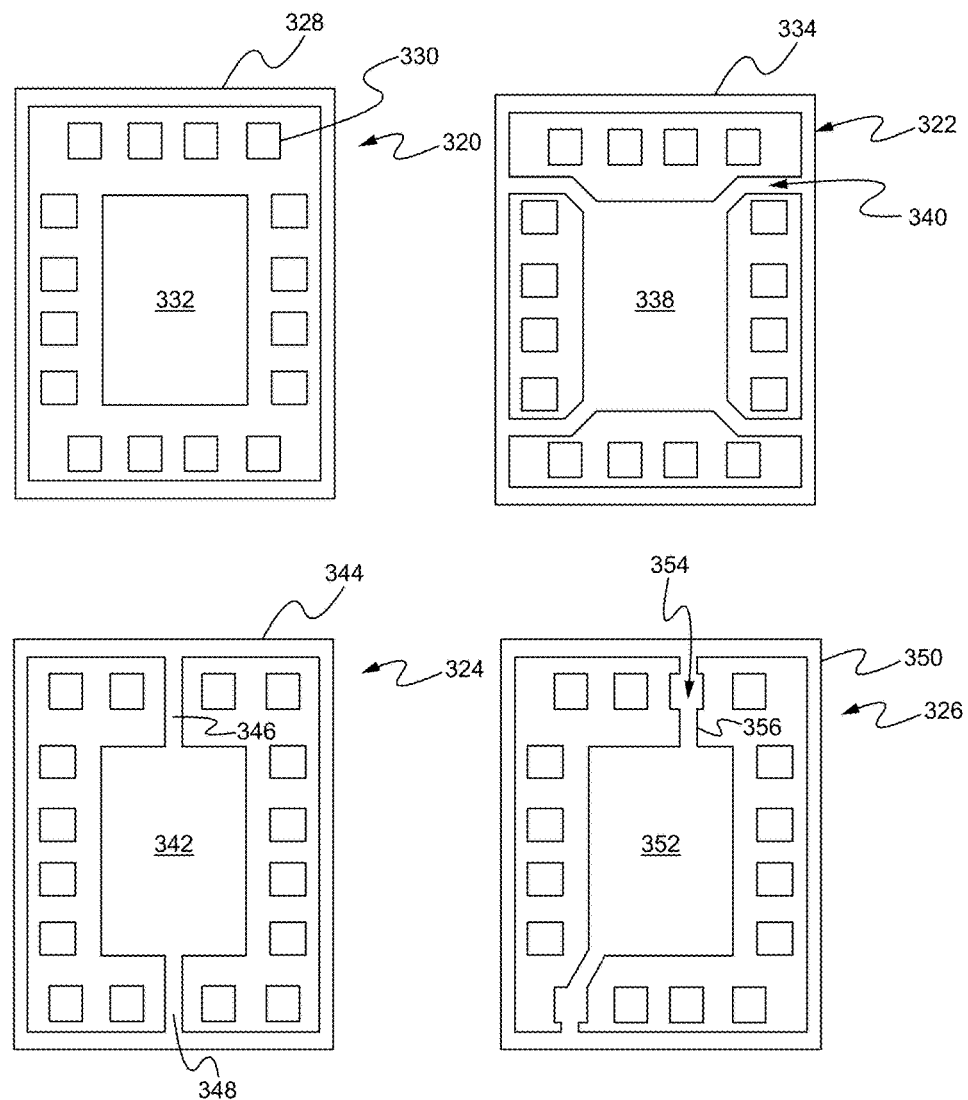
FIG. 3B illustrates exemplary ground ring structures in accordance with some embodiments of the present invention.

FIG. 3B illustrates exemplary ground ring structures in accordance with some embodiments of the present invention. In some embodiments, the ground ring can be grounded by PCB circuit and/or wire bond in the semiconductor package. A first exemplary ground ring structure 320 comprises a ground ring 328 having no connection with a ground paddle 332 and no connection with device pins 330. A second exemplary ground ring structure 322 comprises a ground ring 324 coupled with a ground paddle 338. The coupling between the ground ring 324 and the ground paddle 338 can be through connections 340, which form conductive channels to two sides of the ground ring 334. A third exemplary ground ring structure 324 comprises a ground ring 344 coupled with a ground paddle 342 via a top connecting channel 346 and a bottom connecting channel 348. A fourth exemplary ground ring structure 326 comprises a ground ring 350 coupled with a ground paddle 352 and device pins 354 via one or more connecting channels 356. The exemplary ground ring structures 320, 322, 324, and 326 are shown from bottom/terminal views of the semiconductor packages. A person of ordinary skill in the art appreciates that various ground ring structures are within the scope of the present invention. Different connecting patterns can be formed based on specific functions as needed, such as the thickness and the shape of the shield.

Figure 4:
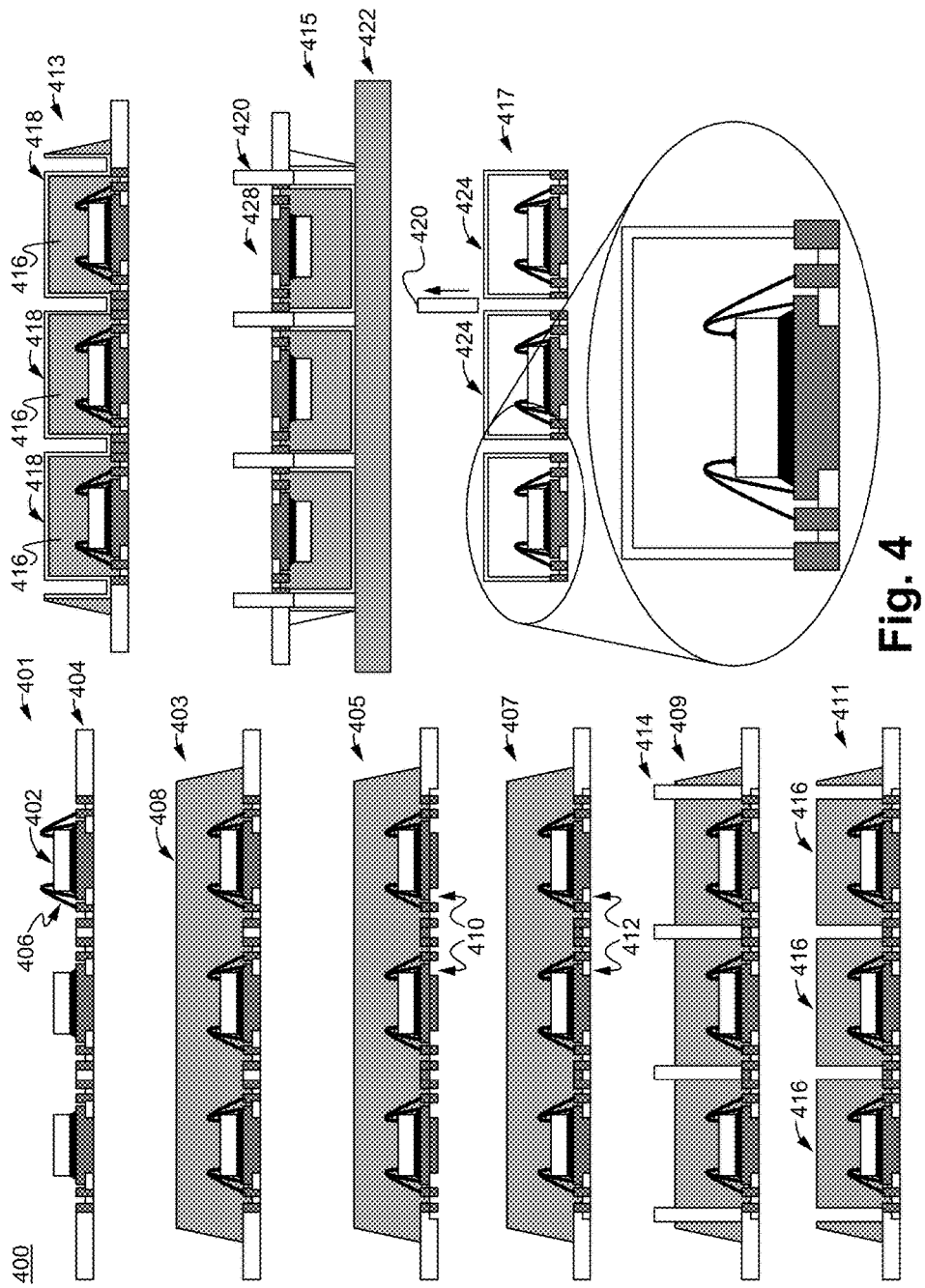
FIG. 4 illustrates a packing forming process of manufacturing the semiconductor device of FIG. 2 in accordance with some embodiments of the present invention.

FIG. 4 illustrates a package forming process 400 of manufacturing the semiconductor device 200 of FIG. 2 in accordance with some embodiments of the present invention. At Step 401, one or more dies 402 are attached to a substrate 404. The substrate 404 can be a laminate substrate or a leadframe substrate. Wire bonding is performed using wires 406. At Step 403, molding is performed to encapsulate the dies and wires inside a molding material 408. At Step 405, back etching is performed on a surface of the substrate 404, forming a back-etched surface 410. At Step 407, insulation molding is performed to form an insulation layer 412 on the back-etched surface 410. At Step 409, a cutting tool 414, such as saw or laser, is used to partially cut the package. At Step 411, partially cut molded array 416 is formed. At Step 413, screen-printing or dipping/spraying coating is used to form a layer of conductive coating 418 on the molded array 416. The conductive coating 418 can be formed of conductive polymers (such as conductive polyurethane and polyimide) or metallic materials. At Step 415, a second singulation procedure is performed. The molded array with the layer of conductive coating is flipped to be attached with a singulation dicing tape 422. A tool 420 is used to fully cut the molded array forming individual units 428. At Step 417, the removal of the tool 420 forms finished units 424.

Figure 5:
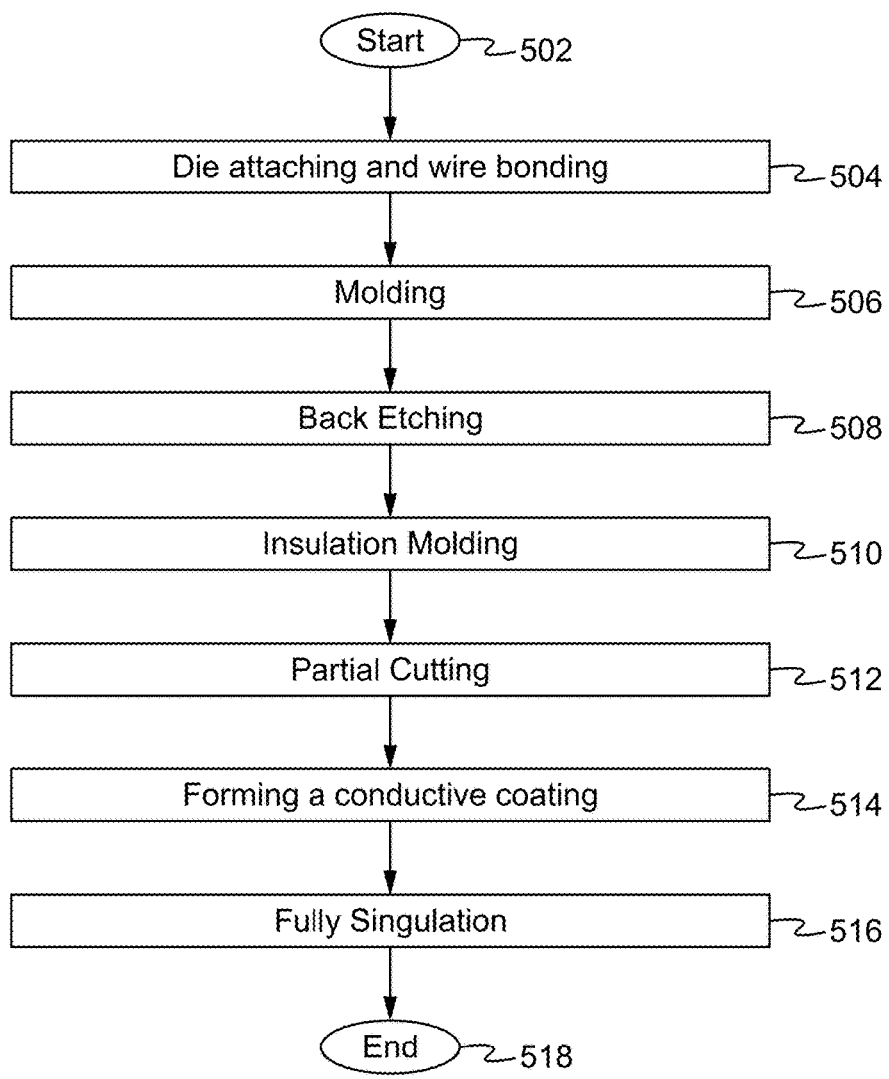
FIG. 5 is a flow chart illustrating an exemplary conductive shield forming process in accordance with some embodiments of the present invention.

FIG. 5 is a flow chart illustrating an exemplary conductive shield forming process 500 in accordance with some embodiments of the present invention. The method 500 can start at Step 502. At Step 504, dies are attached and wires are bonded to a substrate. At Step 506, molding is performed. At Step 508, back-etching is performed. At Step 510, insulation molding is performed. At Step 512, partial cutting is performed. At Step 514, a conductive coating is formed. At Step 516, full singulation is performed. The method 500 can stop at Step 518.

The conductive polymer shield can be utilized to shield and prevent electromagnetic interference. In operation, the conductive polymer shield provide a function as a Faraday cage, which results from an external static electric field causing the electric charges within the cage's conducting material to be distributed such that the field's effect in the cage interior is cancelled.

Figure 6:
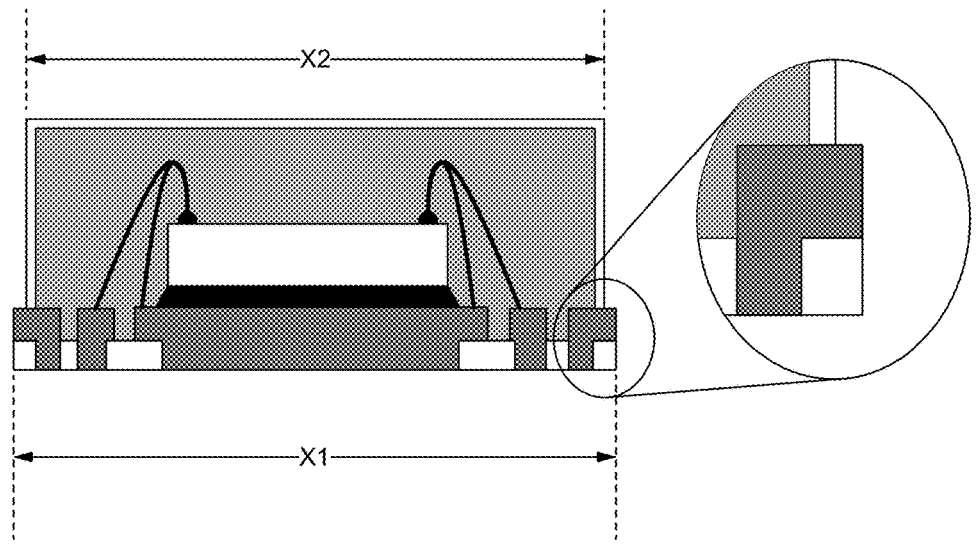
FIG. 6 illustrates dimensions of the semiconductor package of FIG. 2 in accordance with some embodiments.

FIG. 6 illustrates dimensions of the semiconductor package 200 in accordance with some embodiments. The top surface of the semiconductor package 200 is smaller than the bottom surface of the semiconductor package 200. In some embodiments, the bottom width X1 of the semiconductor package 200 is larger than the top width X2 of the semiconductor package 200 as two differently sized cutting tools were used to fully singulate the semiconductor package 200. The protective layer 202 (e.g., conductive polymer shield) is formed over the surfaces of the molding material 206, including the top surface and side surfaces of the molding material 206 but not over sides of exterior package terminals 208.

Figure 7:
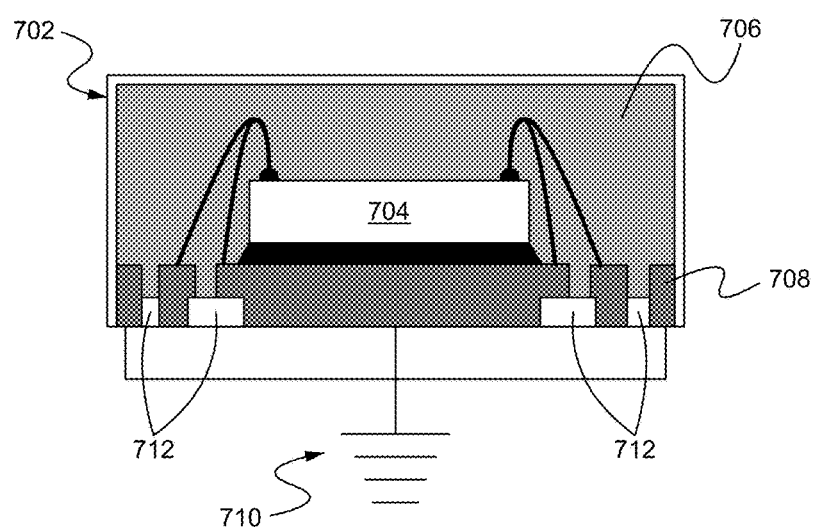
FIG. 7 illustrates a cross-sectional view of another exemplary semiconductor package in accordance with some embodiments of the present invention.

FIG. 7 illustrates a cross-sectional view of another exemplary semiconductor package 700 in accordance with some embodiments of the present invention. In some embodiments, the package 700 has electronic component(s) 704, such as a die, coupled with a molding material 706 and a ground ring 708 coupled with a PCB ground 710. Exemplary ground ring structures are illustrated in FIG. 3B. A protective layer 702 can be formed over the molding material 706, including the top surface and side surfaces of the molding material, and over side surfaces of external package terminals 708. The electronic component 704 can be coupled with the ground ring 708. In some embodiments, insulating materials 712 enclose the package 700. In some embodiments, the insulating materials 712 are located at a bottom of the package 700. As shown in FIG. 7, the insulating materials 712 are between terminals and a die attach pad at the bottom of the semiconductor package 700.

In some embodiments, the protective layer 702 includes a metal, such Ni (Nickel), Cu (Copper), Cu+Ni. A person of ordinary skill in the art appreciates that any other metals are able to be used to form the protective layer 702. In some embodiments, the protective layer 702 provides a Faraday cage effect, which forms an enclosure blocking a transmission or reception of ratio frequency waves and any other types of electromagnetic radiation, such as radio frequency interference (FRI).

Figure 8:
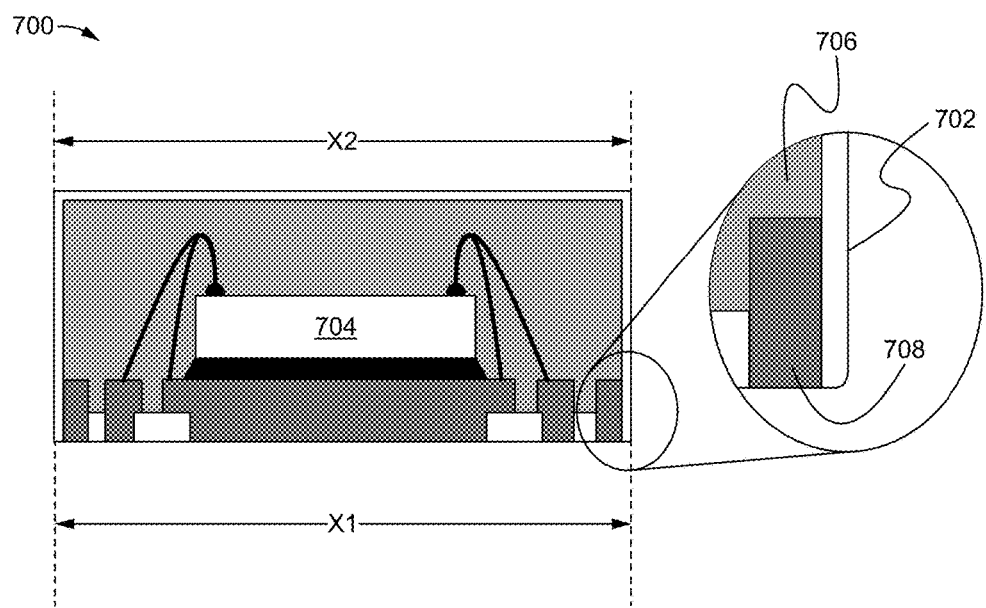
FIG. 8 illustrates dimensions of the semiconductor package of FIG. 7 in accordance with some embodiments.

FIG. 8 illustrates dimensions of the semiconductor package 700 in accordance with some embodiments. The top surface of the semiconductor package 700 has the same size as the bottom surface of the semiconductor package 700. In some embodiments, the bottom width X1 and the top width X2 of the semiconductor package 700 are of the same size. Side surfaces of the exterior package terminals 708 are substantially aligned with side surfaces of the molding material 706. In contrast to the protective layer 202, the protective layer 702 (e.g., metal-plated shield) is formed over the surfaces molding material 706, including the top surface and side surfaces of the molding material 706, and also over side surfaces of the exterior package terminals 708. In some embodiments, these exterior package terminals 708 that have the protective layer 702 coated over their surfaces form a ground ring structure, such as those illustrated in FIG. 3B. In some embodiments, the electronic component 704 is coupled to a die attach pad and interior package terminals.

Figure 9:
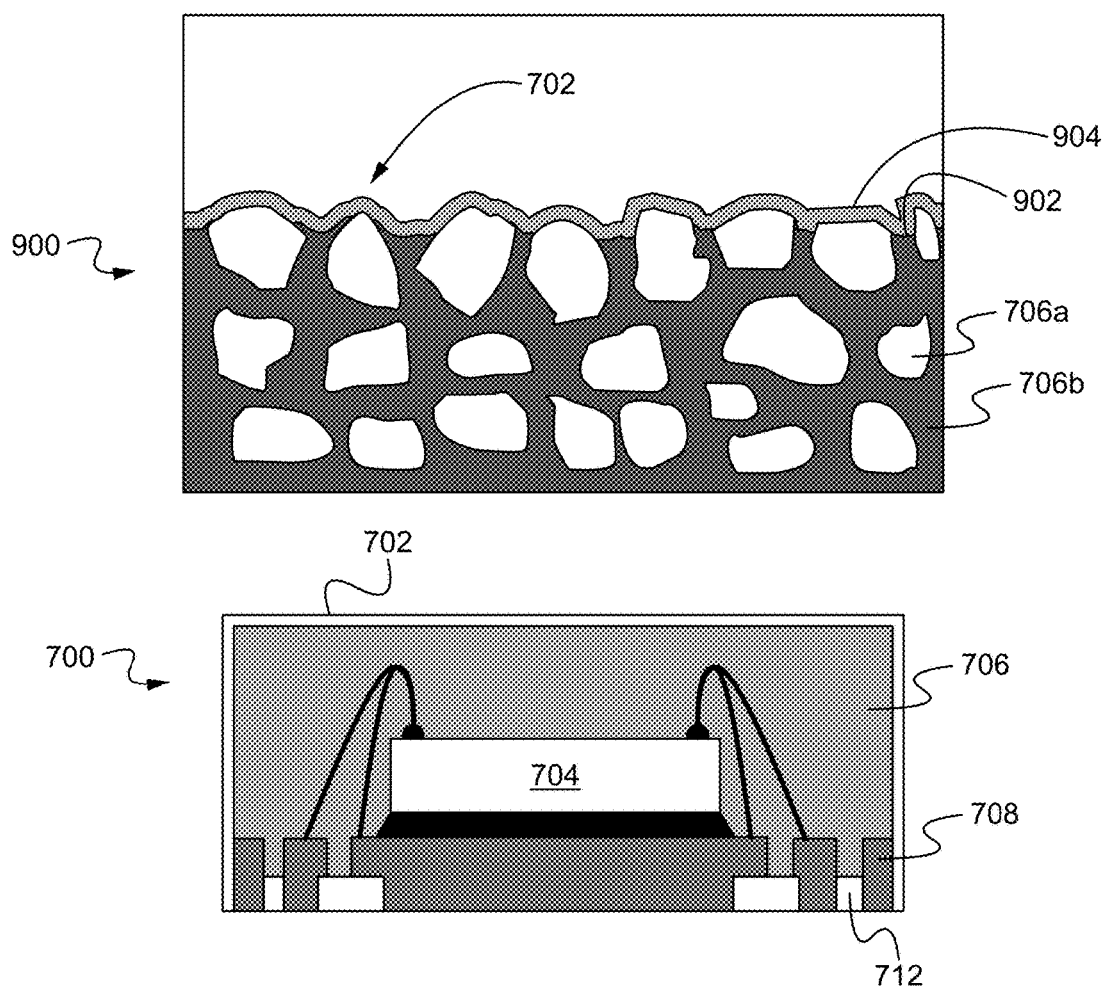
FIG. 9 illustrates a magnified view of the adhesion between a protective layer and surfaces of molding compound of the semiconductor package of FIG. 7 in accordance with some embodiments of the present invention.
Figure 10A:
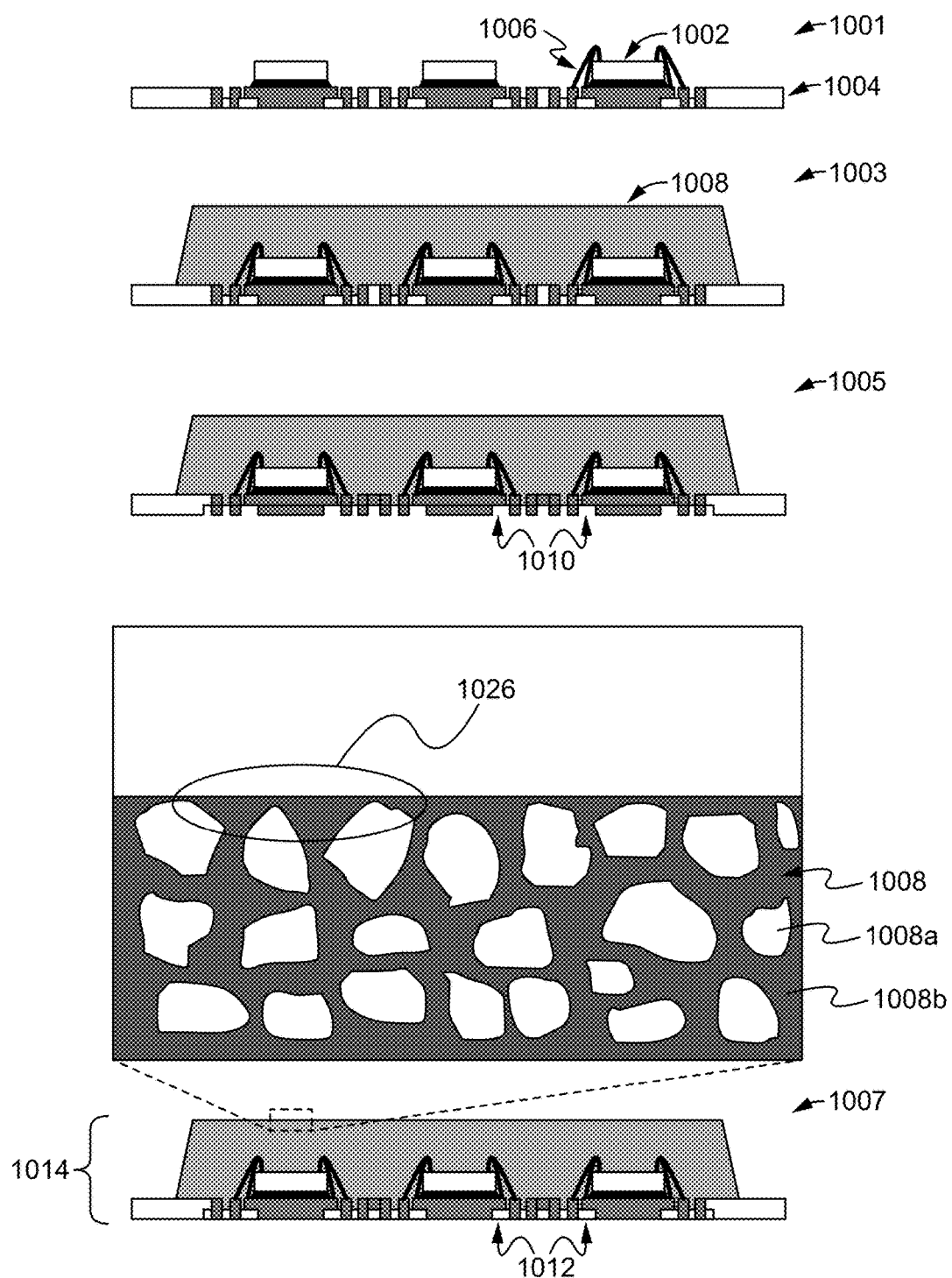
FIGS. 10A-10F illustrate a package forming process of manufacturing the semiconductor device of FIG. 7 in accordance with some embodiments of the present invention.
Figure 10B:
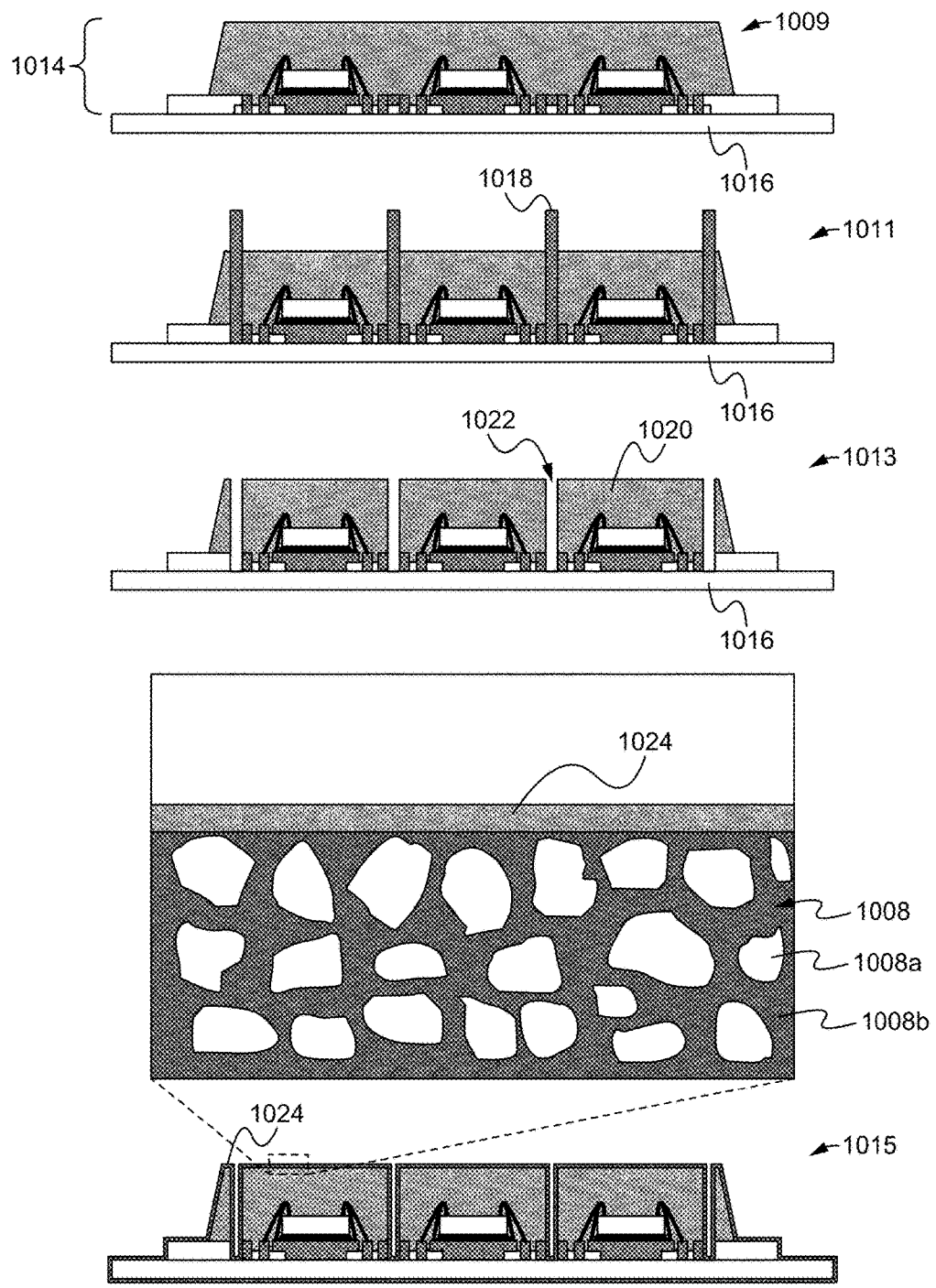
Figure 10C:
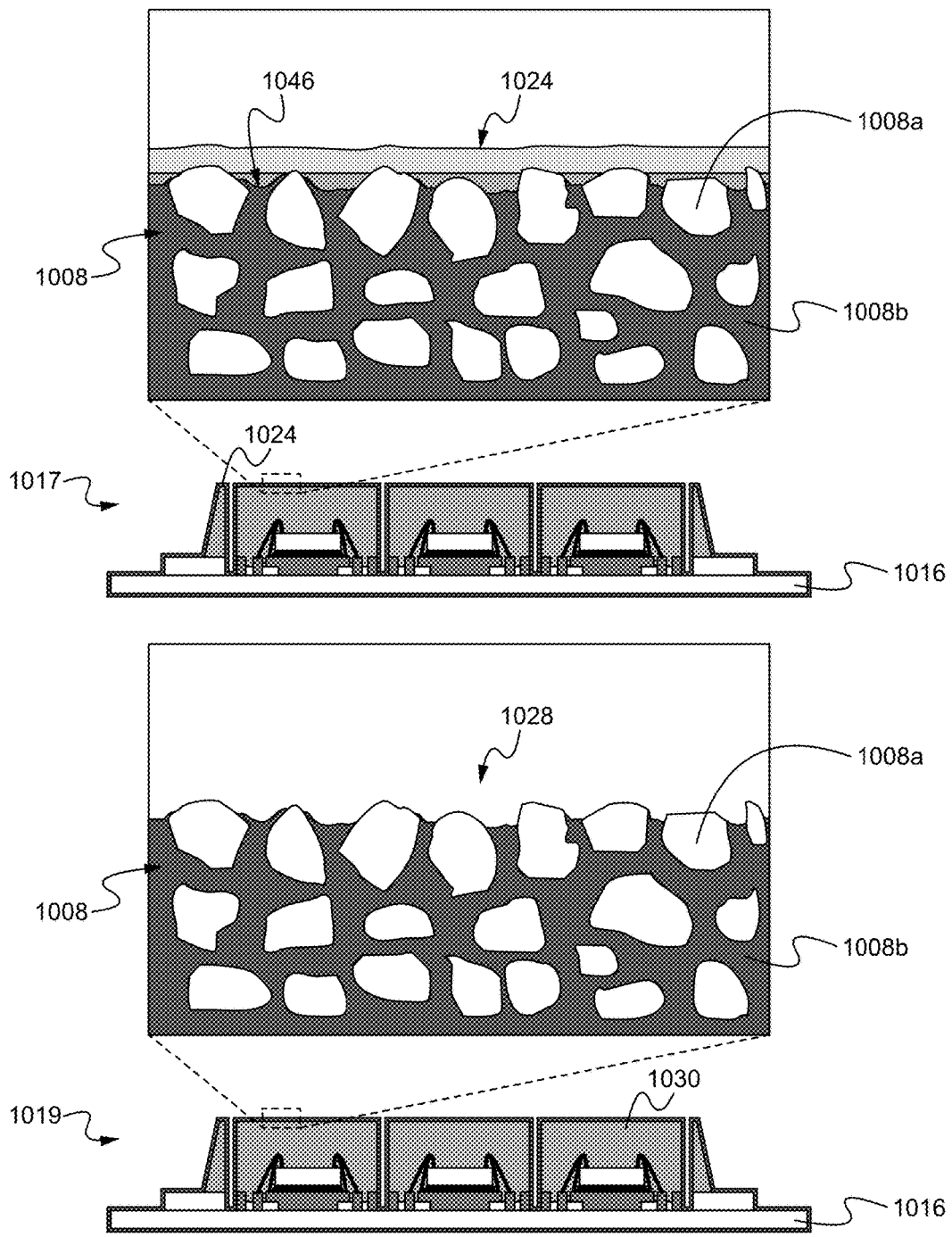
Figure 10D:
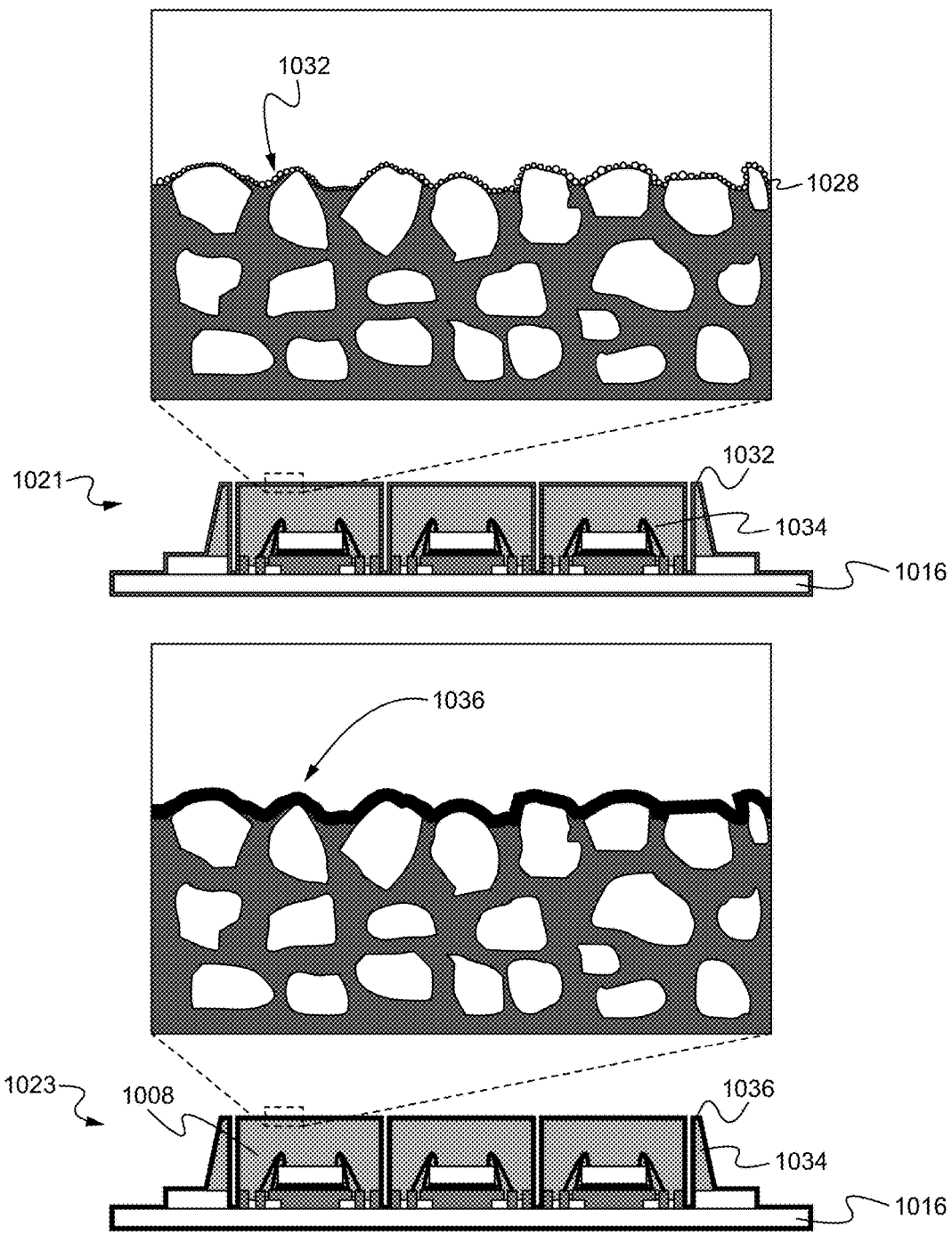
Figure 10E:
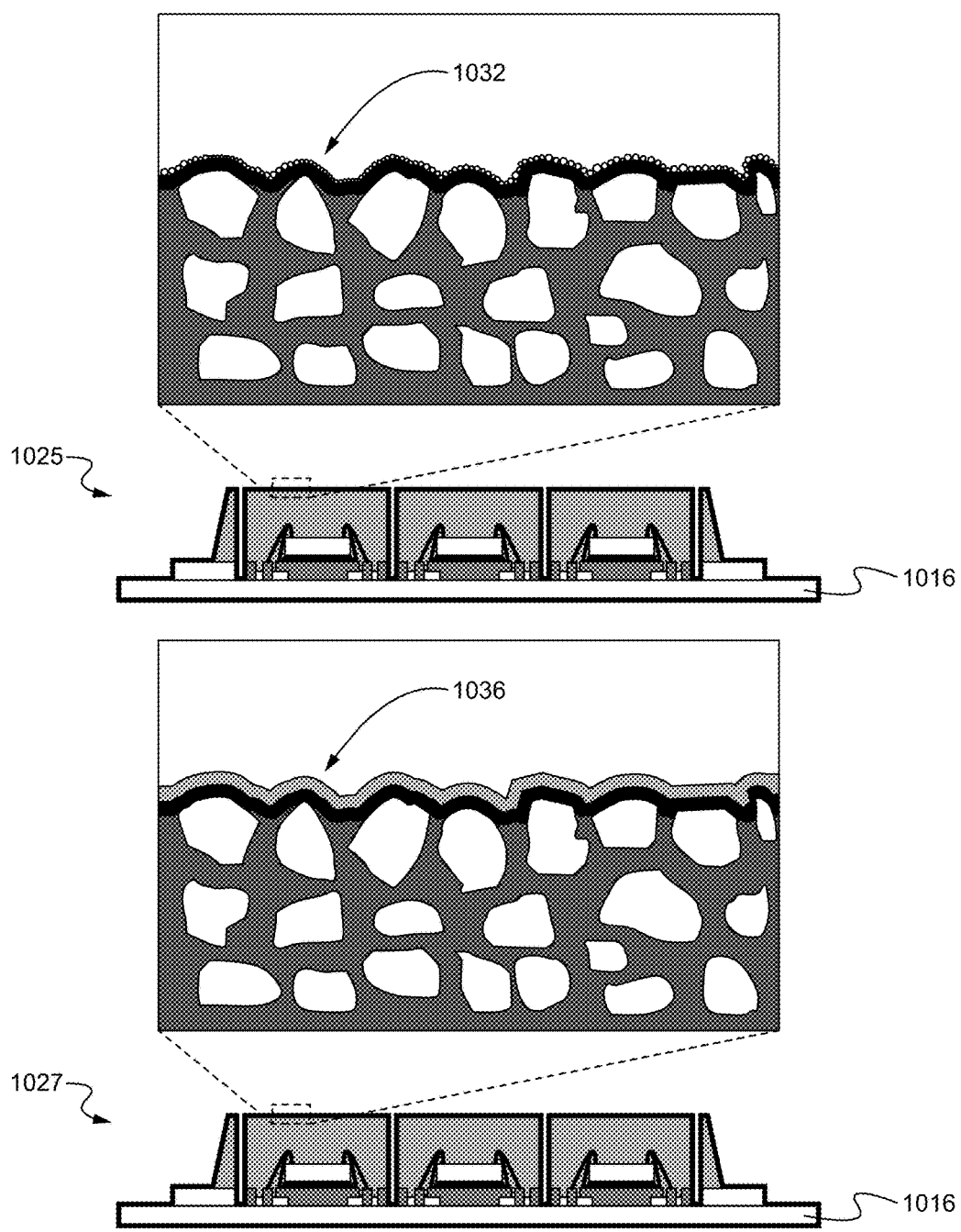
Figure 10F:
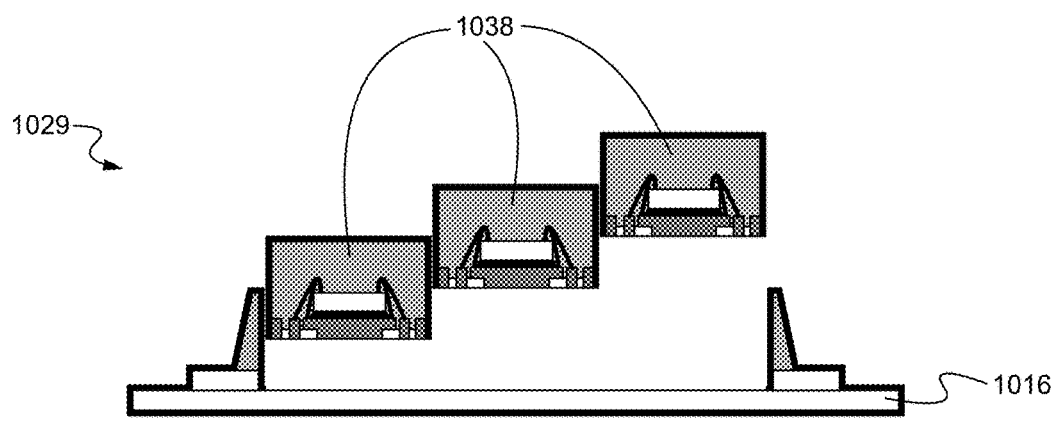

FIG. 9 illustrates a magnified view 900 of the adhesion between the protective layer 702 and the surfaces of the molding compound 706 of the semiconductor package 700 in accordance with some embodiments of the present invention. The high magnification view 900 shows the unnatural surface roughness 902 of the molding compound 706 after a surface treatment process that is required prior to an electroless plating process in order to achieve an adhesion with the protective layer 702 that is better than an adhesion with the protective layer 702 when the surfaces of the molding compound 706 are not treated (e.g., surfaces of the molding compound 706 having the natural surface roughness). After the surface treatment process, the unnatural surface roughness 902 of the surfaces of the molding compound 706 is rougher than the natural surface roughness of the surfaces the molding compound 706. The molding compound 706 comprises compound fillers 706a and compound resin 706b. Roughness 904 of a portion of the protective layer 702 is caused by the unnatural surface roughness 902 of the surfaces of the molding compound 706. In some embodiments, the roughness 904 of the portion of the protective layer 702 that is adhered to the surfaces of the molding compound 706 conforms to the unnatural surface roughness 902 of the surfaces of the molding compound 706.

FIGS. 10A-10F illustrate a package forming process 1000 of manufacturing the semiconductor device 700 of FIG. 7 in accordance with some embodiments of the present invention. At Step 1001, one or more dies 1002 are coupled with a substrate 1004. The substrate 1004 can be a laminate substrate or a leadframe substrate, such as a molded leadframe. Coupling of the one or more dies 1002 with the substrate 1004 can be via wires 1006 (as illustrated) or via metallic bumps (not illustrated). At Step 1003, molding is performed to encapsulate the dies 1002 inside a molding material 1008, which includes compound fillers 1008a and compound resin 1008b. Circuitry is inside the molding material 1008. At Step 1005, back etching is performed on a surface of the substrate 1004, forming a back-etched surface 1010. At Step 1007, insulation molding is performed to form an insulation layer 1012 on the back-etched surface 1010. A magnified view is provided of the natural surface roughness 1026 of the molding compound 1008 of a molded array 1014 before a surface treatment process (abrasion procedure). The molded array 1014 includes a package/top side and an interfacing/bottom side.

Continuing with the process 1000, at Step 1009, the molded array 1014 is coupled with a tape 1016 at the bottom side of the molded array 1014 to protect areas that are not to be plated from being plated. In some embodiments, the tape 116 is able to withstand a high temperature application and sustain the subsequent chemical processes such that the protected areas are not affected. At Step 1011, a cut through procedure is performed from the top side to the bottom side of the molded array 1014. A tool 1018, such as a saw, is used to fully cut the molded array 1014 to the tape 1016. At Step 1013, individual/discrete units 1020 are formed on the tape 1016. The cut through procedure of the Step 1011 results in open areas 1022 between the individual units 1020 exposing some of the terminals of each units 1020 at its sides. Each unit 1020 has a top surface that is the same size as a bottom surface. Each unit 1020 has a bottom width that is of the same size as a top width.

To prepare the molding material 1008 for better adhesion with a metal layer, surfaces of the molding material 1008 are roughened so that the surfaces have an unnatural surface roughness that is rougher than the natural surface roughness. At Step 1015, a coating processes is performed to coat an "adhesion promoter" material 1024 on all exposed surfaces of the molding compound 1008, including those in the open areas 1022 that resulted from the cut through procedure of the Step 1011. The coating process can be either a spraying or dipping process. The Step 1015 shows the result from a spraying process, where a bottom of the tape 1016 is not coated. In some embodiments, the bottom of the tape 1016 is coated when a dipping process is performed. The protected areas, such as the bottom side of the molded array 1014, are not coated with the adhesion promoter material 1024 because of the tape 1016 covering those protected areas. A magnified view is provided of the layer of adhesion promoter 1024 directly on top of the surfaces the molding compound 1008.

Continuing with the process 1000, at Step 1017, the molded array 1014 with the substrate adhesion promoter material 1024 is heated. In some embodiments, the molded array 1014 with the substrate adhesion promoter material 1024 is heated to 90° C. to 150° C. for approximately 10 minutes, for example, in an oven. Other temperatures and other heating durations are contemplated. The adhesion promoter material 1024 is activated with the heat, thereby reacting with a portion 1046 of the molding compound 1008, resulting in a baked film. In particular, the adhesion promoter material 1024 reacts with the molding resin 1008b in the portion 1046 of the molding compound 1008 but not with the compound filler 1008a in the portion 1046 of the molding compound 1008. In addition, the adhesion promoter material 1024 does not react with the substrate 1004 and the tape 1016.

At Step 1019, the baked film is etched away, leaving the surfaces of the molding compound 1008 that are rougher 1028 than the natural surface roughness 1026 of the molding compound 1008 (e.g., before the surface treatment process). Put differently, after the baked film is etched away, the surfaces of the molding compound 1008 have an unnatural surface roughness. In some embodiments, a wet chemical permanganic acid is used to etch out the baked film, resulting a roughened array 1030. The roughness 1028 of the surfaces of the molding compound 1008, which is created at least by the compound fillers 1008a, provides anchor points for an activator chemical in a catalysis process. Other abrasion processes are contemplated to roughen the surfaces of the molding compound 1008 to obtain an unnatural surface roughness.

Continuing with the process 1000, at Step 1021, a depositing process is performed to coat the activator chemical 1032 on the roughened array 1030. The depositing process can be either a spraying or dipping process. The Step 1021 shows the result from a dipping process, where the bottom of the tape 1016 is coated. In some embodiments, the bottom of the tape 1016 is not coated when a spraying process is performed. In some embodiments, the activator chemical 1032 includes Pd (Palladium), which reacts as a catalyst substance. In some embodiments, the activator chemical 1032 includes a catalyst substance other than Pd. In some embodiments, the activator chemical 1032 includes additional additives. The catalyst substance anchors on to the roughened surface 1028 of the molding compound 1008, resulting in an active array 1034, which has an active molding compound surface.

At Step 1023, a plating process is performed to plate the active array 1034 with a metal chemical solution 1036. The plating process can be an electroless plating process. An exemplary metal substance in the metal chemical solution is Cu, Ni or another suitable metal substance. The metal substance in the metal chemical solution reacts with the Pd on the active molding compound surface. The metal substance anchors on to the active molding compound surface. The adhesion of the metal layer 1036 with the molding compound 1008 having the roughened surface 1028 is better than the adhesion of the metal layer 1036 with one having the natural surface roughness 1026 prior to the surface treatment process.

It is possible to plate multi-metal layers on top of each other, as illustrated optional Steps 1025 and 1027. Each new metal substance anchors to the previous anchored metal on the molding compound surface or on a previous anchored metal on metal. At the Step 1025, another coating process is performed to coat the activator chemical 1032 on the previously plated metal substrate, such as from the Step 1023. The Step 1025 helps the next electroless plating layer occur faster. At the Step 1027, another plating process is performed to plate the substrate with the metal chemical solution 1036. The metal substance reacts with the Pd on the surface of the previous metal plating (such as Cu). The final result is that the new metal substance anchors on to the surface of the previous metal plating. The new metal layer is stacked on the previous metal layer. This reaction can occur in a loop until a desired electroless plating layer (metal-plated shield) is obtained. The thickness of the electroless plating layer can depend on reaction time.

Continuing with the process 1000, at Step 1029, a plurality of semiconductor devices with metal-plated shields 1038 is removed from the tape 1016. The bottom of each of the packages 1038 is not plated because the tape 1016 covered the bottom of each of the packages 1038 during the plating steps. Each of the plurality of semiconductor devices 1038 is similarly configured at the semiconductor device 700. The plating material covers all surfaces of the molding compound and side surfaces of external terminals. The side surfaces of the molding compound are aligned with the side surfaces of the external terminals. The metal plating layer, which comes from the electroless plating process on the molding compound, reacts as an EMI shield that can replace conventional metal lids and conductive polymer coating. The singulated semiconductor packages 1038 are generally tested, subjected to stress, and tested again to ensure reliability and to filter out non passing or non standard units.

Figure 11:
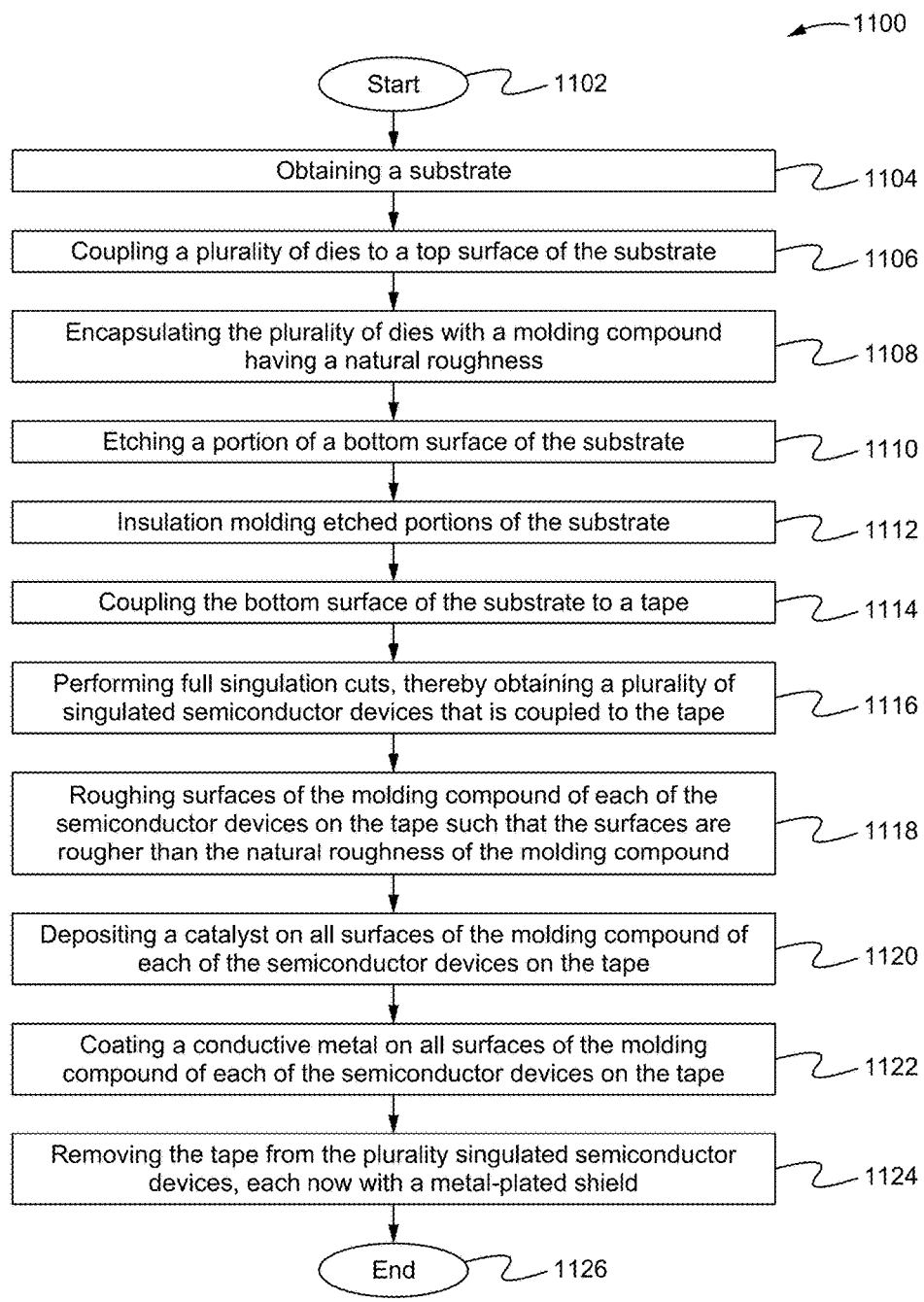
FIG. 11 is a flow chart illustrating another conductive shield forming process in accordance with some embodiments of the present invention.

FIG. 11 is a flow chart illustrating another conductive shield forming process 1100 in accordance with some embodiments of the present invention. The method 1100 can start at Step 1102. At Step 1104, a substrate is obtained. At Step 1106, a plurality of dies is coupled to a top surface of the substrate. At Step 1108, the plurality of dies is encapsulated with a molding compound having a natural surface roughness. At Step 1110, a portion of a bottom surface of the substrate is etched. At Step 1112, insulation molding is performed in etched portions of the substrate. At Step 1114, the bottom surface of the substrate is coupled with tape to create protected areas. The tape prevents these protected areas from being plated with metal in the subsequent steps. At Step 1116, full singulation cuts are performed to obtain a plurality of singulated semiconductor devices that is coupled to the tape. At Step 1118, surfaces of the molding compound of each of the semiconductor devices on the tape are roughened such that the surfaces have an unnatural surface roughness that is rougher than the natural surface roughness. At Step 1120, a catalyst material is deposited on all surfaces of the molding compound of each of the semiconductor devices on the tape. At Step 1122, a conductive metal is coated on all surfaces of the molding compound of each of the semiconductor devices on the tape. In some embodiments, the Steps 1120 and 1122 can be repeated to obtain a desired metal-plated shield. At Step 1124, the tape is removed from the plurality of singulated semiconductor devices, each now with a metal-plated shield. The method 1100 can stop at Step 1126.

The metal-plated shield can be utilized to shield and prevent electromagnetic interference. In operation, the metal plating shield provide a function as a Faraday cage, which results from an external static electric field causing the electric charges within the cage's conducting material to be distributed such that the field's effect in the cage interior is cancelled.

Although one package type is discussed above in FIGS. 7-10F, different package types are contemplated and can be formed using the discussed molding compound surface preparation techniques. It should also be understood that even though the discussed molding compound surface preparation pertains to adhesion of molding compound and a metal layer, a surface(s) of a molding compound can also be prepared accordingly for adhesion with another molding compound layers (multi-molding compound layers). An exemplary molding compound to molding compound adhesion is discussed in the co-pending U.S. patent application Ser. No. 15/167,724, entitled "A Method of Improving Adhesion between Molding Compounds and an Apparatus thereof," filed on May 27, 2016, which is hereby incorporated by reference in its entirety.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A semiconductor package comprising:
   a leadframe including a plurality of terminals, wherein the plurality of terminals includes exterior terminals, wherein each of the exterior terminals is exposed at a bottom of the semiconductor package and is at a side of the semiconductor package;
   a die;
   a molding compound partially encapsulating the die and the exterior terminals, wherein the molding compound includes molding resin and molding fillers dispersed in the molding resin and has surfaces that have an unnatural surface roughness that is rougher than the natural surface roughness of the molding compound, wherein the surfaces are substantially formed by a portion of the molding fillers protruding beyond all of the various uppermost surfaces of the molding compound resin; and
   a metal-plated shield adhered to the surfaces of the molding compound and to side surfaces of the exterior terminals.

2. The semiconductor package of claim 1, wherein the metal-plated shield includes a plurality of metal layers plated on top of each other.

3. The semiconductor package of claim 1, wherein the metal-plated shield is not adhered to a bottom surface of the semiconductor package.

4. The semiconductor package of claim 1, wherein the side surfaces of the exterior terminals are substantially aligned with side surfaces of the molding compound.

5. The semiconductor package of claim 1, wherein the roughness of a portion of the metal-plated shield that is adhered to the surfaces of the molding compound conforms to the unnatural surface roughness of the molding compound.

6. The semiconductor package of claim 5, further comprising a catalyst material anchored to the surfaces of the molding compound and configured to react with a metal on the surfaces of the molding compound to form the metal-plated shield.

7. The semiconductor package of claim 6, further comprising a protected area that is coupled with a tape that covers the entirety of the protected area of the semiconductor package such that the protected area does not have the metal-plated shield adhered to the protected area.

8. The semiconductor package of claim 7, wherein the semiconductor package is positioned adjacent to at least one other semiconductor package on the tape.

9. The semiconductor package of claim 8, wherein the at least one other semiconductor package on the tape is similarly configured as the semiconductor package.

10. A semiconductor package comprising:
a leadframe including a plurality of terminals;
a die coupled with a first surface of the leadframe;
a molding compound partially encapsulating the die, wherein the molding compound includes molding resin and molding fillers dispersed in the molding resin and has surfaces that have an unnatural surface roughness that is rougher than the natural surface roughness of the molding compound, wherein the surfaces are substantially formed by a portion of the molding fillers protruding beyond all of the various uppermost surfaces of the molding compound resin; and
a metal-plated shield adhered to the surfaces of the molding compound.

11. The semiconductor package of claim 10, wherein the metal-plated shield includes a plurality of metal layers plated on top of each other.

12. The semiconductor package of claim 10, wherein the leadframe is a molded leadframe.

13. The semiconductor package of claim 10, wherein the plurality of terminals includes exterior terminals.

14. The semiconductor package of claim 13, wherein each of the exterior terminals is exposed at and flush with a bottom surface of the semiconductor package and is at a side surface of the semiconductor package.

15. The semiconductor package of claim 10, wherein the roughness of a portion of the metal-plated shield that is adhered to the surfaces of the molding compound conforms to the unnatural surface roughness of the molding compound.

16. The semiconductor package of claim 15, further comprising a catalyst material anchored to the surfaces of the molding compound and configured to react with a metal on the surfaces of the molding compound to form the metal-plated shield.

17. The semiconductor package of claim 10, further comprising a protected area that is coupled with a tape that covers the entirety of the protected area of the semiconductor package such that the protected area does not have the metal-plated shield adhered to the protected area.

18. The semiconductor package of claim 17, wherein the semiconductor package is positioned adjacent to at least one other semiconductor package on the tape.

19. The semiconductor package of claim 18, wherein the at least one other semiconductor package on the tape is similarly configured as the semiconductor package.

20. The semiconductor package of claim 18, wherein the metal-plated shield continuously extends from the semiconductor package to the at least one other semiconductor package on the tape and to a bottom side of the tape.

* * * * *